United States Patent
Noda et al.

(10) Patent No.: US 11,257,616 B2
(45) Date of Patent: Feb. 22, 2022

(54) POWER CONVERSION DEVICE AND HIGH-VOLTAGE NOISE FILTER

(71) Applicant: Hitachi, Ltd., Tokyo (JP)

(72) Inventors: Masaki Noda, Tokyo (JP); Hiroki Funato, Tokyo (JP); Isao Hoda, Tokyo (JP); Hitoshi Taniguchi, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 285 days.

(21) Appl. No.: 16/720,995

(22) Filed: Dec. 19, 2019

(65) Prior Publication Data

US 2020/0203055 A1 Jun. 25, 2020

(30) Foreign Application Priority Data

Dec. 20, 2018 (JP) .............................. JP2018-238310

(51) Int. Cl.
| | |
|---|---|
| *H02M 1/44* | (2007.01) |
| *H01F 27/08* | (2006.01) |
| *H01F 27/24* | (2006.01) |
| *H02M 7/00* | (2006.01) |
| *H03H 7/01* | (2006.01) |
| *H01F 27/40* | (2006.01) |
| *H02P 27/06* | (2006.01) |
| *H02M 7/537* | (2006.01) |

(52) U.S. Cl.
CPC .............. *H01F 27/08* (2013.01); *H01F 27/24* (2013.01); *H01F 27/40* (2013.01); *H02M 1/44* (2013.01); *H02M 7/003* (2013.01); *H03H 7/0115* (2013.01); *H03H 7/17* (2013.01); *H02M 7/537* (2013.01); *H02P 27/06* (2013.01)

(58) Field of Classification Search
CPC ......... H02M 1/44; H02M 7/003; H01F 27/08; H01F 27/24; H03H 7/0115
See application file for complete search history.

(56) References Cited

U.S. PATENT DOCUMENTS

| | | | | |
|---|---|---|---|---|
| 6,392,364 | B1* | 5/2002 | Yamamoto | H05B 41/02 315/291 |
| 2015/0009727 | A1* | 1/2015 | Zhou | H02M 7/5387 363/40 |
| 2017/0005581 | A1 | 1/2017 | Fukumasu et al. | |

FOREIGN PATENT DOCUMENTS

WO    WO 2015/133201 A1    9/2015

* cited by examiner

*Primary Examiner* — Adolf D Berhane
*Assistant Examiner* — Afework S Demisse
(74) *Attorney, Agent, or Firm* — Crowell & Moring LLP

(57) ABSTRACT

A high-voltage noise filter of a power conversion device includes: a metal housing; an anode bus bar connecting anodes of a power source and a power module; a cathode bus bar connecting cathodes thereof; a first magnetic core having a through hole where the anode bus bar and the cathode bus bar pass through; an X capacitor having one end connected to the anode bus bar, and the other end connected to the cathode bus bar; a first Y capacitor having one end connected to the anode bus bar, and the other end grounded; a second Y capacitor having one end connected to the cathode bus bar, and the other end grounded; and a first cooling unit connected to the first magnetic core and the metal housing. The anode bus bar partly faces the first cooling unit, and the cathode bus bar partly faces the first cooling unit.

20 Claims, 12 Drawing Sheets

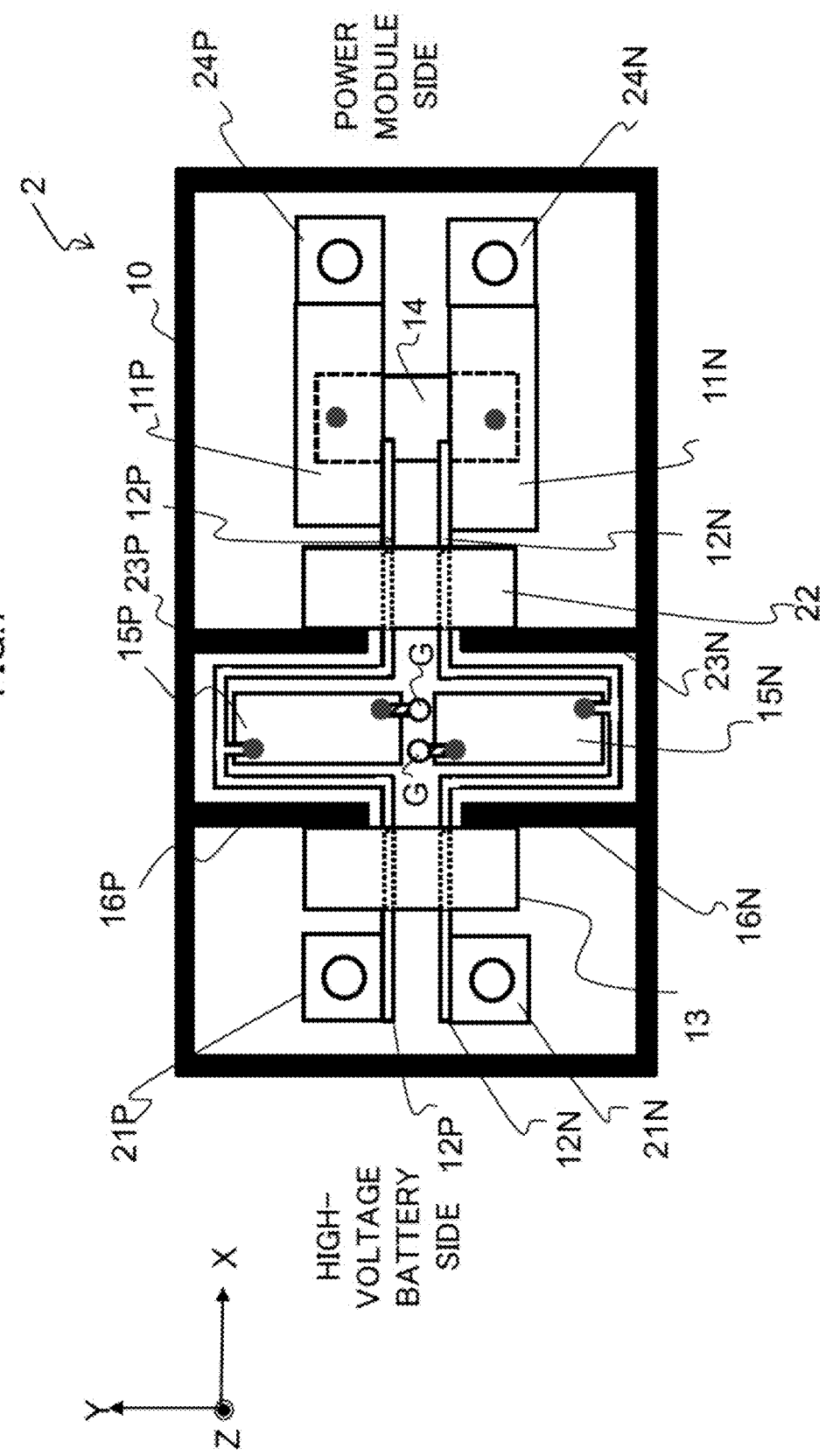

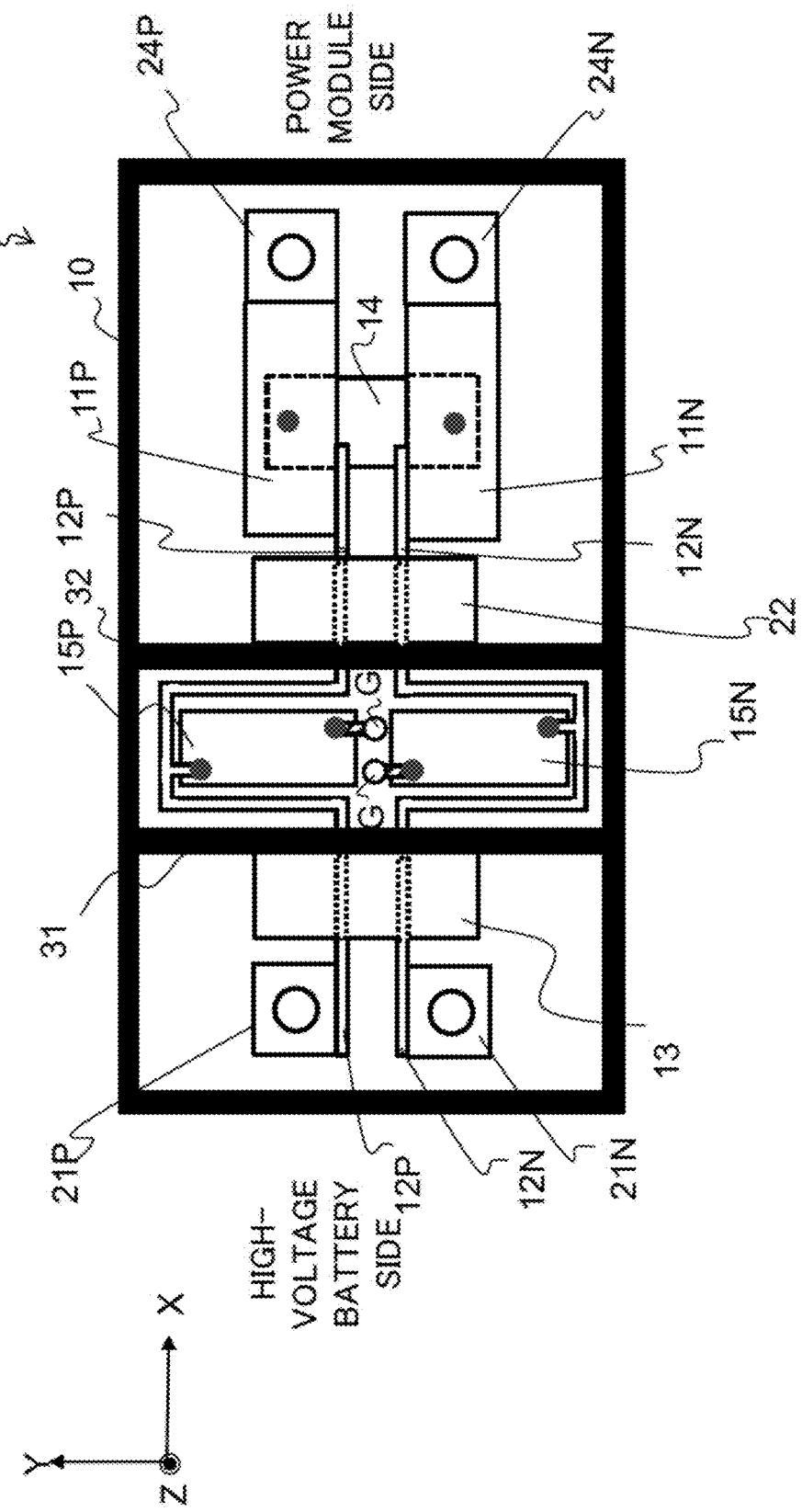

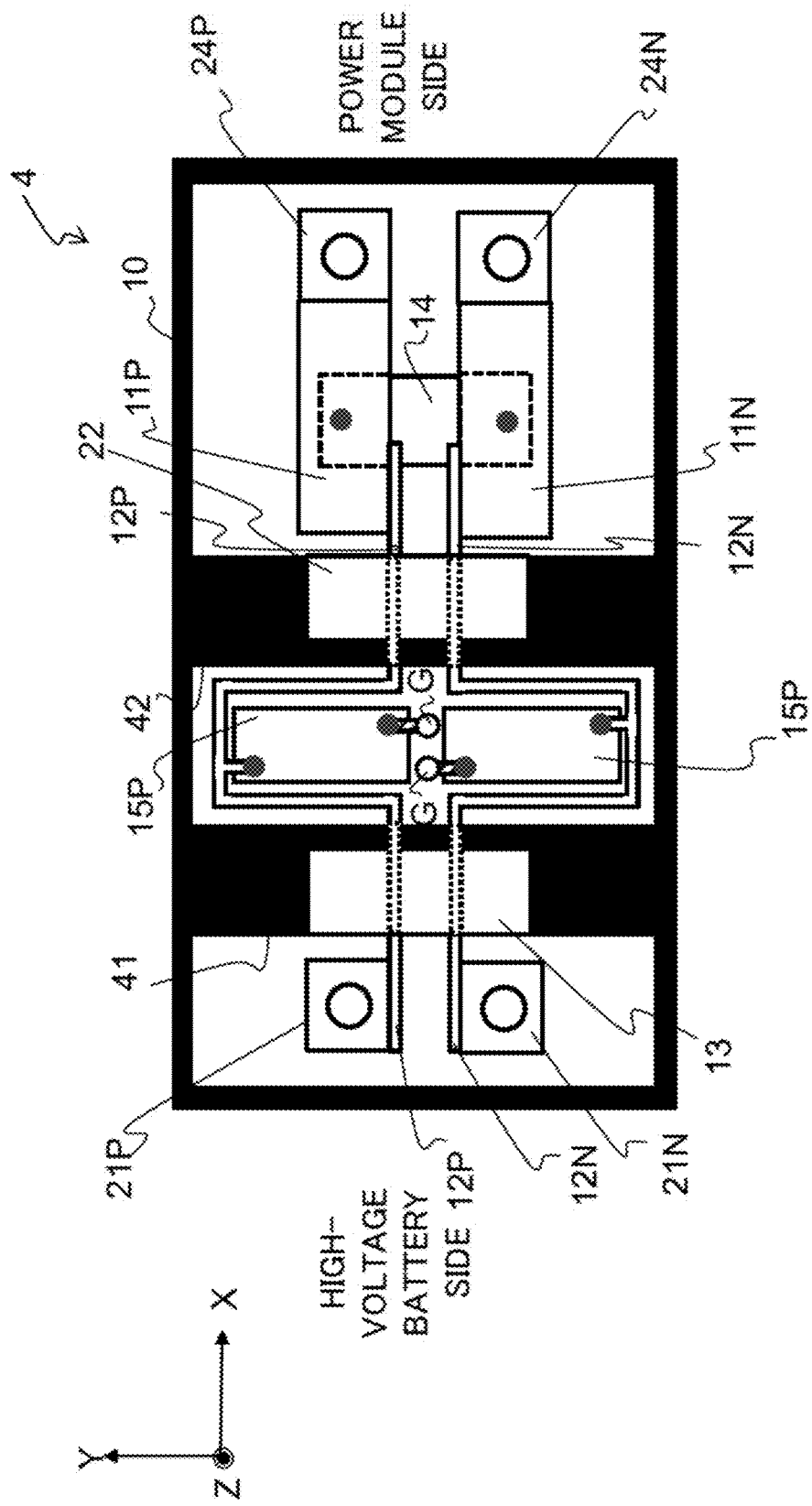

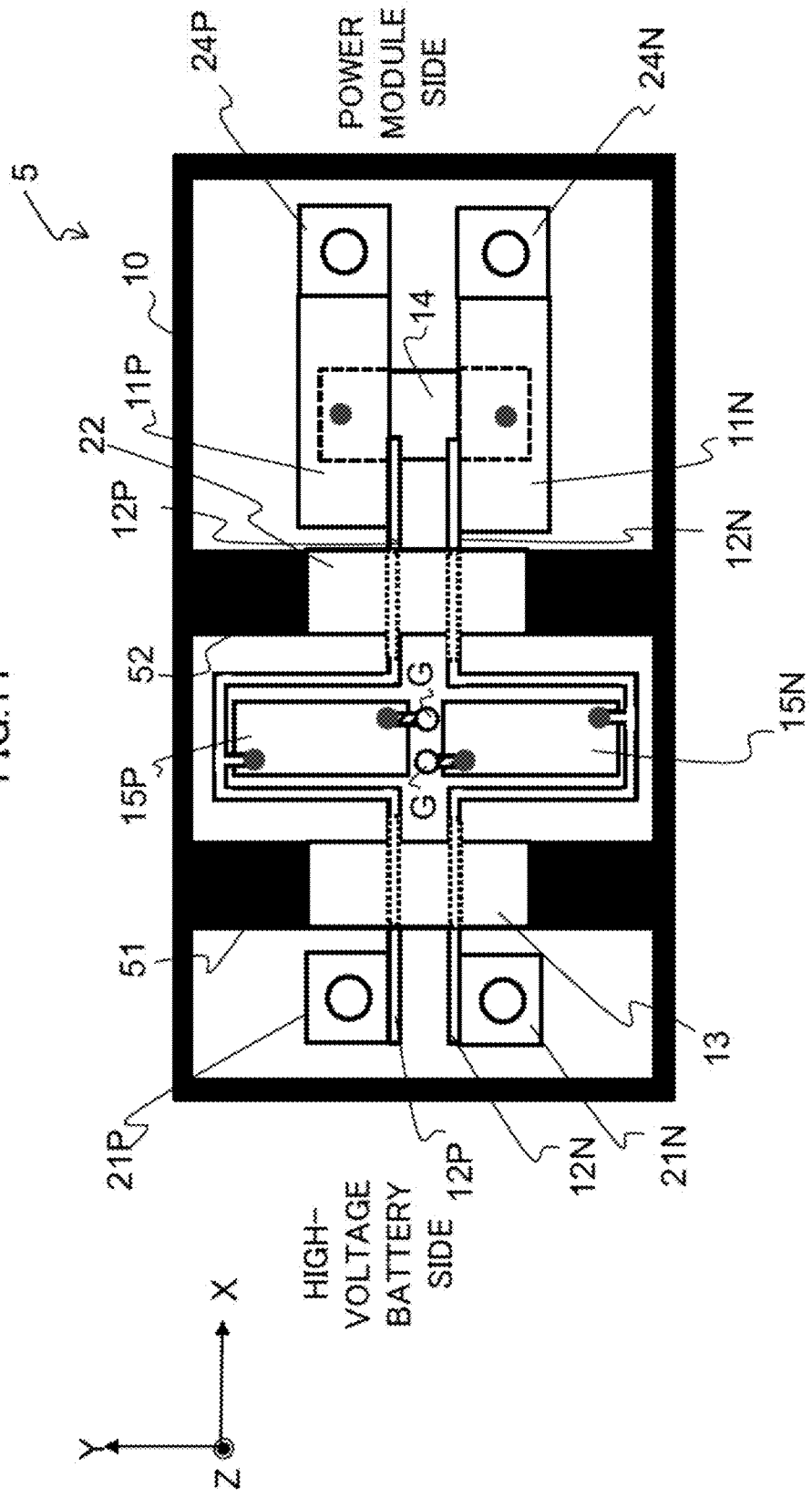

POWER CONVERSION DEVICE AND HIGH-VOLTAGE NOISE FILTER

CLAIM OF PRIORITY

This application claims the priority based on the Japanese Patent Application No. 2018-238310 filed on Dec. 20, 2018. The entire contents of which are incorporated herein by reference for all purpose.

BACKGROUND

Technical Field

The present invention relates to a power conversion device and a high-voltage noise filter.

Related Art

In an electric vehicle, a plug-in hybrid vehicle, and the like, a higher voltage is progressively employed in a power drive battery for the purpose of improving charging efficiency. Additionally, in an electric vehicles or the like, DC current output from the power drive battery is converted to AC current by a power conversion device (inverter) and then supplied to a three-phase motor so as to drive the three-phase motor with the AC current to rotate tires.

In a power conversion device, it is known that an electromagnetic noise is generated during power conversion, adversely affects another electronic circuit mounted on an electric vehicle or the like, and causes malfunction and the like. Additionally, it is also known that the electromagnetic noise generated from the power conversion device is increased along with: increase in a voltage of the input DC current; and increase in a frequency of the output AC current.

Considering such situations, conventionally, a high-voltage noise filter is provided in the power conversion device in order to suppress the generated electromagnetic noise from being propagated to the outside of the power conversion device via a cable and the like. The high-voltage noise filter includes: a magnetic core functioning as an inductor (L) constituting an LC filter; and a capacitor (C).

Incidentally, the magnetic core included in the high-voltage noise filter generates heat due to the generated electromagnetic noise, and a heat generation amount is increased along with increase in the electromagnetic noise. Therefore, in the case where a voltage of the power drive battery is increased, a measure to dissipate the heat is required because the increase of the electromagnetic noise causes increase in the heat generation amount of the magnetic core. Additionally, a measure to suppress the increased electromagnetic noise is also required.

Regarding a heat dissipation structure in the power conversion device, WO 2015/133201 A discloses a structure in which a cooling medium is circulated in an entire housing of the power conversion device.

SUMMARY

As an exemplary measure to dissipate heat from a magnetic core, a method of providing a heat sink in the magnetic core is conceivable.

Also, as an exemplary measure to suppress an electromagnetic noise, a method of increasing capacitance of a capacitor constituting an LC filter is conceivable.

However, in the case of providing the heat sink in the magnetic core and further increasing the capacitance of the capacitor, an entire size of a high-voltage noise filter is increased and the weight is also increased. Such situations are not preferable in consideration of in-vehicle use.

The present invention is made in view of the above-described situations, and an object of the present invention is to achieve both heat dissipation from a magnetic core and improvement in a suppression effect of an electromagnetic noise.

The present application includes a plurality of means to solve at least a part of the above-described problems, and an example thereof is as follows. To solve the above-described problems, a power conversion device according to an aspect of the present invention includes: a power module that converts DC current to AC current; and a high-voltage noise filter that suppresses an electromagnetic noise generated from the power module. The high-voltage noise filter includes: a metal housing that is grounded; an anode bus bar connecting an anode of a power source of the DC current and an anode of the power module; a cathode bus bar connecting a cathode of the power source and a cathode of the power module; a first magnetic core formed in an annular shape and having a through hole where the anode bus bar and the cathode bus bar are made to pass through; an X capacitor having one end connected to the anode bus bar and having the other end connected to the cathode bus bar; a first Y capacitor having one end connected to the anode bus bar and having the other end grounded; a second Y capacitor having one end connected to the cathode bus bar and having the other end grounded; and a first cooling unit connected to the first magnetic core and the metal housing. A part of the anode bus bar is arranged in a manner facing the first cooling unit, and a part of the cathode bus bar is arranged in a manner facing the first cooling unit.

According to the present invention, it is possible to achieve both heat dissipation from the magnetic core and improvement in a suppression effect of an electromagnetic noise.

Problems, configurations, and advantageous effects other than those described above will be clarified by the following description of embodiments.

BRIEF DESCRIPTION OF DRAWINGS

FIG. 7 is an XY plan view illustrating an exemplary configuration of a high-voltage noise filter according to a second embodiment of the present invention;

FIG. 8 is an XY plan view illustrating an exemplary configuration of a high-voltage noise filter according to a third embodiment of the present invention;

FIG. 9 is an XY plan view illustrating an exemplary configuration of a high-voltage noise filter according to a fourth embodiment of the present invention;

FIG. 10A is the view illustrating a single body of the cooling fin, and FIG. 10B is the view illustrating a state in which the cooling fin is connected to the magnetic core;

FIG. 11 is an XY plan view illustrating an exemplary configuration of a high-voltage noise filter according to a fifth embodiment of the present invention.

DETAILED DESCRIPTION

Respective embodiments described below will be described by being divided into a plurality of sections or embodiments as necessary for convenience, but these sections or embodiments are not irrelevant to each other unless otherwise explicitly stated, and one relates to another in all or a part of modification examples, details, supplementary descriptions, and the like. Additionally, in the respective embodiments described below, in the case of referring to the number of elements (including number of pieces, numerical values, amounts, ranges, and the like), the number of the elements is not limited to the specific number and may be the specific number or more or the specific number or less unless otherwise explicitly stated, unless otherwise apparently limited to the specific number in principle, and the like.

Furthermore, in the respective embodiments described below, it goes without saying that constituent elements (including element steps and the like) are not constantly indispensable unless otherwise explicitly stated, unless otherwise apparently indispensable in principle, and the like. Similarly, in the respective embodiments described below, in the case of referring to shapes of the constituent elements, a positional relation therebetween, and the like, substantially approximate or similar shapes or the like are included unless otherwise explicitly stated, unless otherwise apparently unconceivable in principle, and the like. The similar applies to the numerical values and the ranges mentioned above. Additionally, a member having the same function will be denoted by the same reference sign as a principle in all of the drawings to describe the respective embodiments, and repetition of the same description will be omitted.

<Outline of Embodiment According to Present Invention>

First, an outline of an embodiment according to the present invention will be described.

Figure 1:
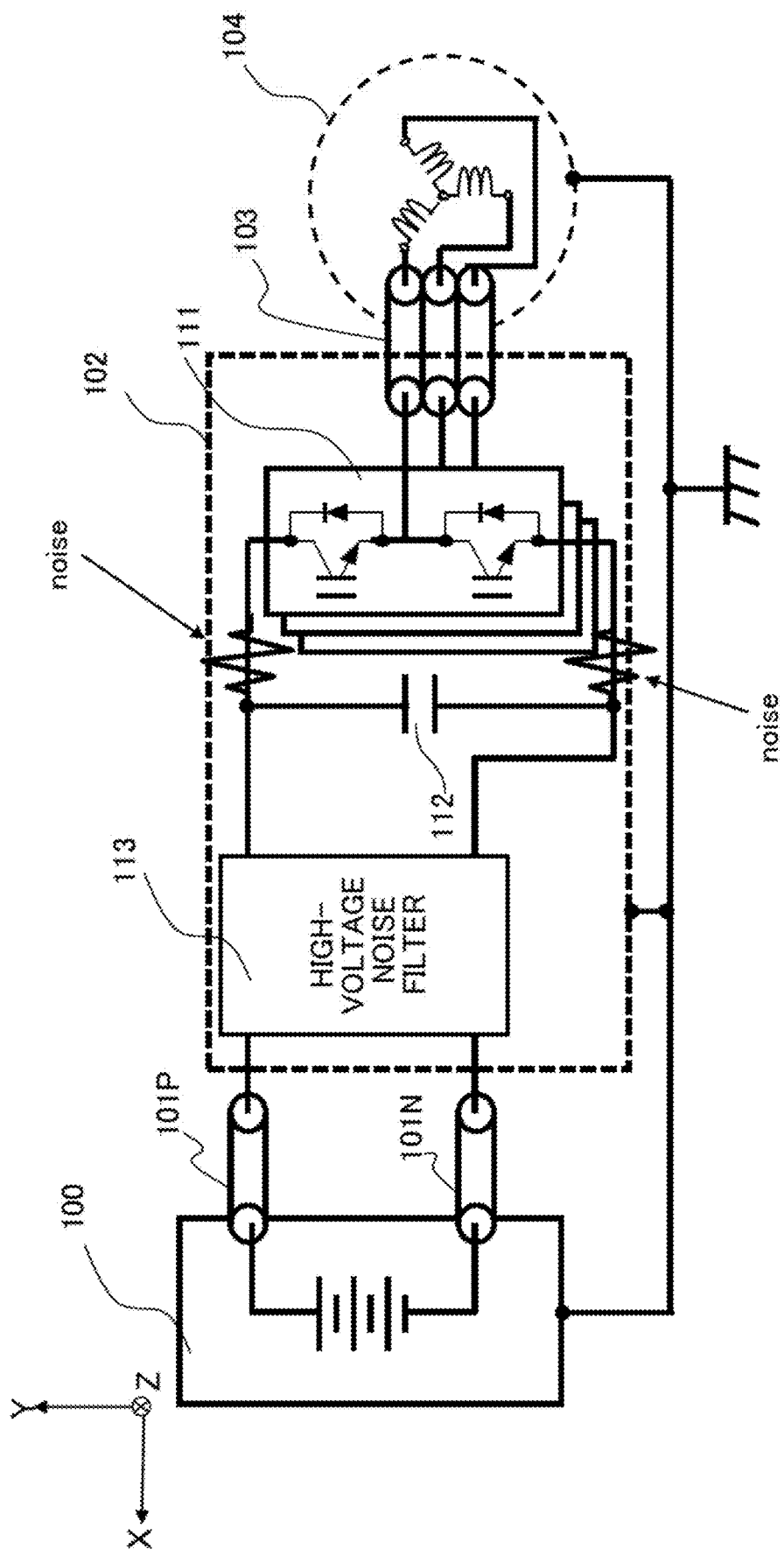
FIG. 1 is a diagram illustrating an exemplary connection between a high-voltage battery, a power conversion device, and a three-phase motor.

FIG. 1 illustrates an exemplary connection between a high-voltage battery 100, a power conversion device 102, and a three-phase motor 104 which are mounted on an electric vehicle or the like.

The high-voltage battery 100 is a power source used to drive the three-phase motor 104. The high-voltage battery 100 is connected to the power conversion device 102 via an anode bus bar 101P and a cathode bus bar 101N, and outputs DC current of a high voltage (e.g., 600 to 800 [V]) to the power conversion device 102. The high-voltage battery 100 corresponds to a power source of the DC current of the present invention.

The power conversion device 102 converts, into AC current, the DC current input from the high-voltage battery 100, and supplies the AC current to the three-phase motor 104 via a UWV bus bar 103. The three-phase motor 104 is driven by the AC current supplied from the power conversion device 102 and rotates tires of the electric vehicle or the like.

The power conversion device 102 includes a power module 111, a smoothing capacitor 112, and a high-voltage noise filter 113.

The power module 111 includes a plurality of semiconductor switches and the like, and converts the DC current to the AC current by performing switching under the control from a control board or the like (not illustrated).

However, in a case where the power module 111 performs switching, an electromagnetic noise including a common mode noise (in-phase component noise) and a differential mode noise (differential component noise) is generated. The higher the DC current input from the high-voltage battery 100 is and the higher a frequency of a switching frequency is, the larger these electromagnetic noises become. Consequently, these electromagnetic noises may be leaked to the outside of the power conversion device 102 and affect another electronic circuit mounted on the electric vehicle or the like.

The smoothing capacitor 112 smooths fluctuation of the DC current input from the high-voltage battery 100.

Figure 2:
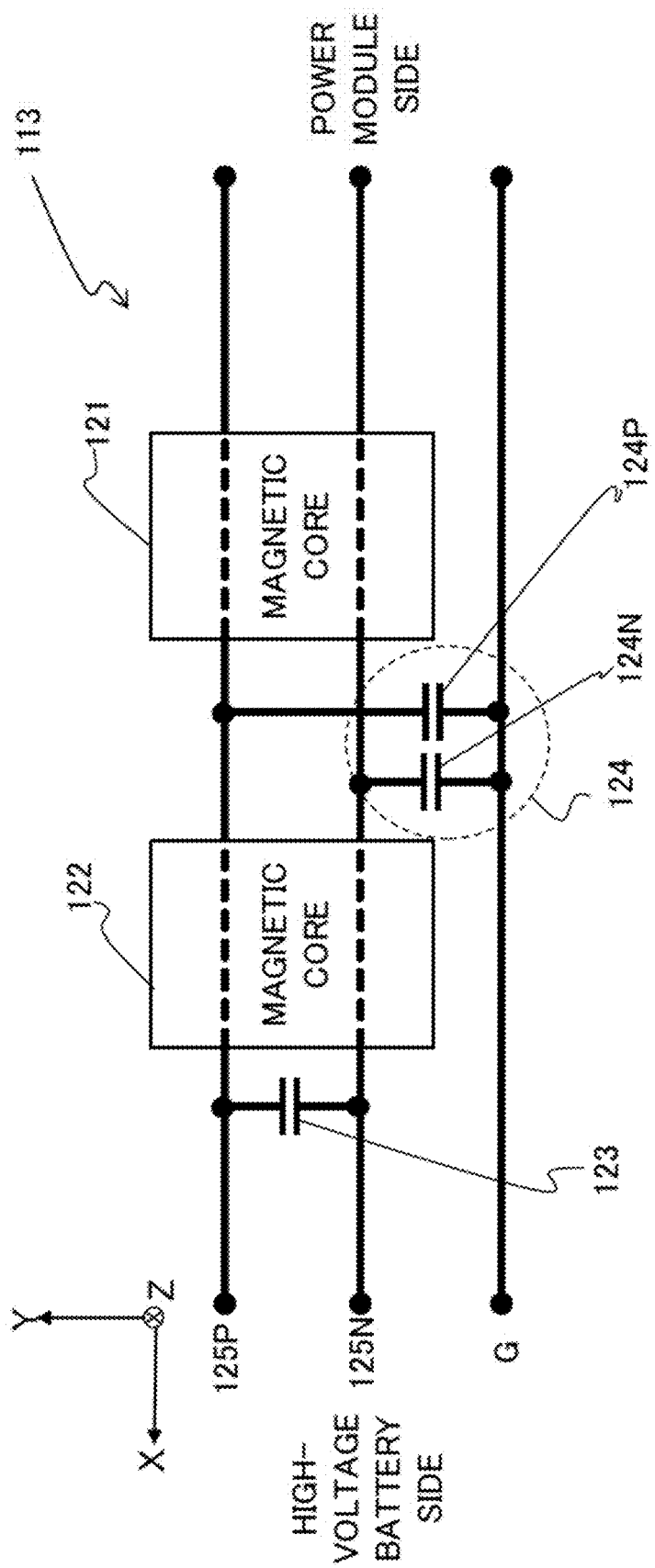
FIG. 2 is a diagram illustrating a conventional exemplary configuration of a high-voltage noise filter.

The high-voltage noise filter 113 is used to suppress an electromagnetic noise generated from the power module 111 and propagated to an anode bus bar 125P (FIG. 2) and a cathode bus bar 125N (FIG. 2).

FIG. 2 illustrates a conventional exemplary configuration of the high-voltage noise filter 113. The high-voltage noise filter 113 includes magnetic cores 121 and 122, an X capacitor 123, and a Y capacitor 124.

Figure 3:
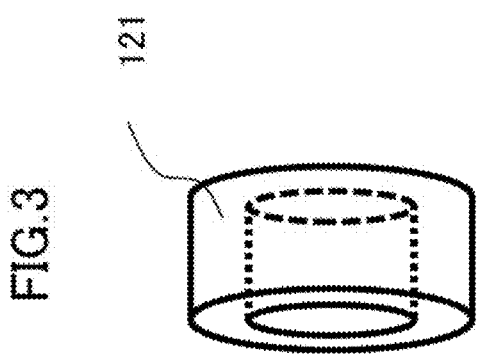
FIG. 3 is a diagram illustrating an exemplary shape of a magnetic core.

FIG. 3 illustrates an exemplary shape of the magnetic core 121. The magnetic core 121 includes MnZn ferrite formed in an annular shape (doughnut shape), FINEMET (trademark), or the like. Note that the magnetic core 122 has a shape similar to that of the magnetic core 121.

The magnetic cores 121 and 122 each include a through hole where the anode bus bar 125P and the cathode bus bar 125N are made to pass through, and the anode bus bar 125P and the cathode bus bar 125N connect the high-voltage battery 100 and the power module 111. Each of the magnetic cores 121 and 122 functions as an inductor (L) constituting an LC filter.

The X capacitor 123 has one end connected to the anode bus bar 125P on the high-voltage battery 100 side of the magnetic core 122, and has the other end connected to the cathode bus bar 125N. The X capacitor 123 constitutes the LC filter together with the magnetic core 122, and can attenuate the differential mode noise generated from the power module 111.

The Y capacitor 124 includes two Y capacitors 124P and 124N. The Y capacitor 124P has one end connected to the anode bus bar 125P between the magnetic core 122 and the magnetic core 121, and has the other end connected to a ground G. The Y capacitor 124N has one end connected to the cathode bus bar 125N between the magnetic core 122 and the magnetic core 121, and has the other end connected to the ground G. The Y capacitor 124 constitutes an LC filter together with the magnetic core 121, and can attenuate the common mode noise generated from the power module 111. In a case where capacitance of the Y capacitor 124 is increased, a suppression effect of the common mode noise can be improved.

By the way, in the high-voltage noise filter 113, the magnetic cores 121 and 122 generate heat due to the common mode noise generated from the power module 111, and particularly, a heat generation amount from the magnetic core 121 located closer to the power module 111 tends to be increased. As described above, in the case where the voltage of the DC current from the high-voltage battery 100 is increased and the switching frequency is increased, the common mode noise is increased. Therefore, since the heat generation amounts from the magnetic cores 121 and 122 are also increased, a heat dissipation structure against the magnetic core 121 is particularly required.

In the present embodiment, both the heat dissipation from the magnetic cores and improvement in the suppression effect of the common mode noise are achieved.

<High-voltage Noise Filter 1 According to First Embodiment of Present Invention>

Figure 4:
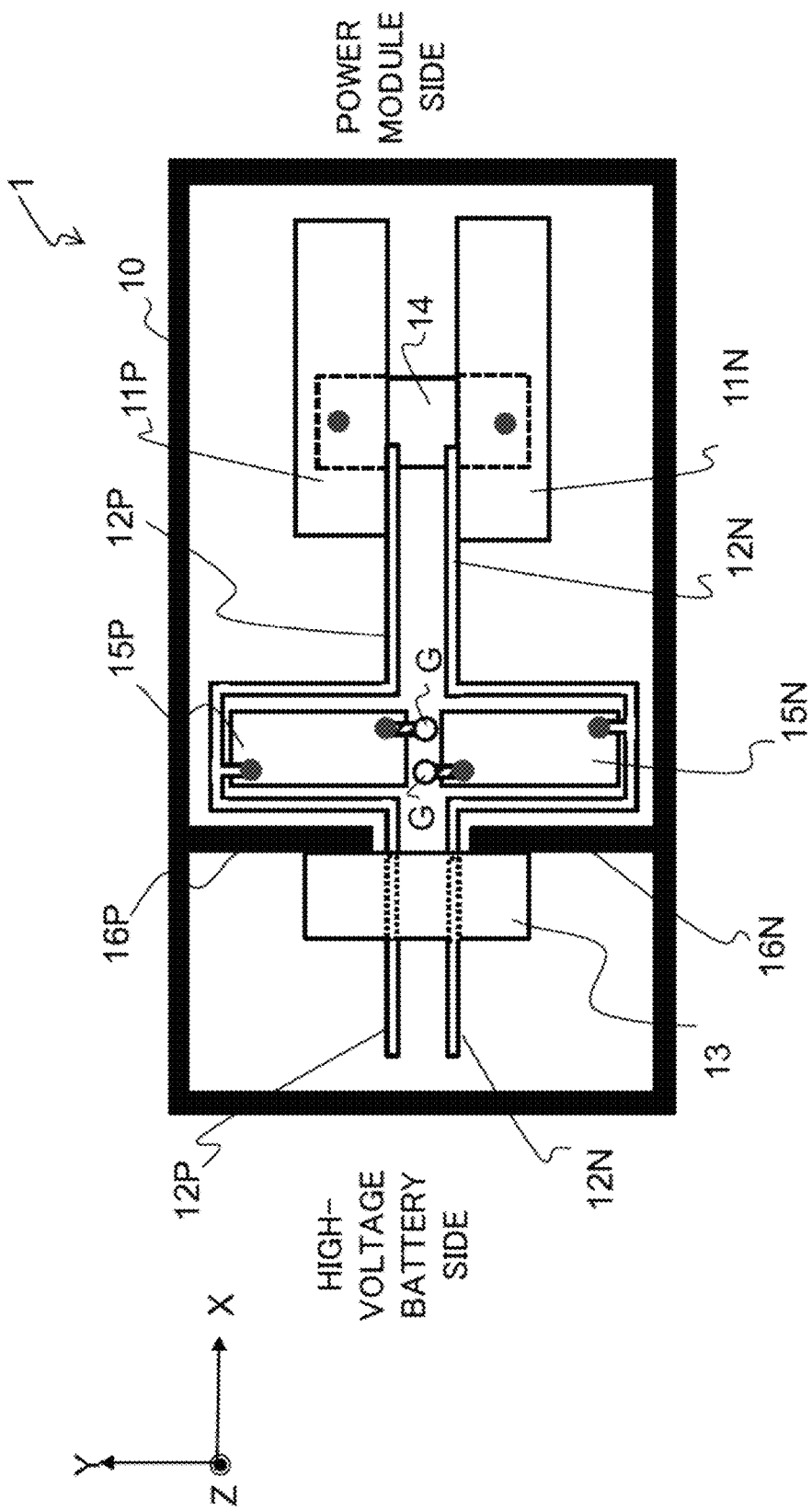
FIG. 4 is an XY plan view illustrating an exemplary configuration of a high-voltage noise filter according to a first embodiment of the present invention.
Figure 5:
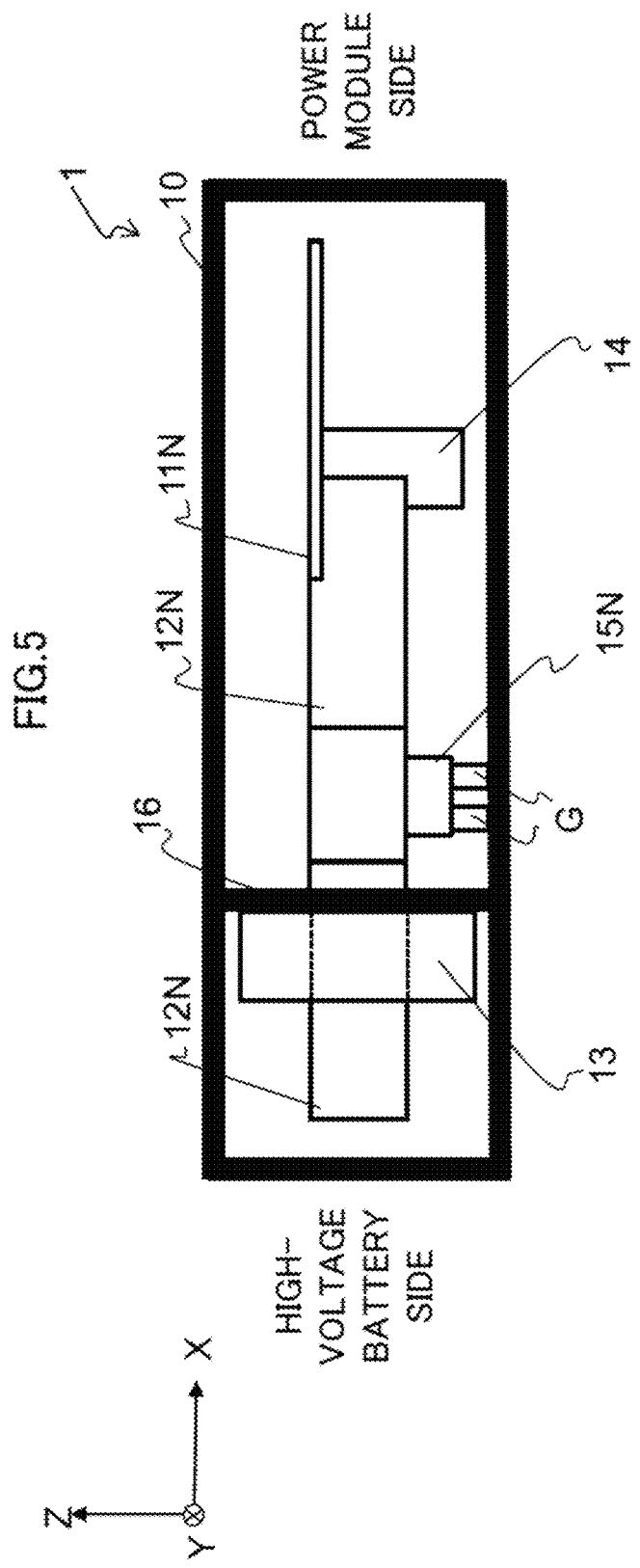
FIG. 5 is an XZ side view of the high-voltage noise filter illustrated in FIG. 4.

Next, FIG. 4 is an XY plan view illustrating an exemplary configuration of a high-voltage noise filter 1 according to a first embodiment of the present invention. FIG. 5 is an XZ plan view illustrating an exemplary configuration of the high-voltage noise filter 1.

The high-voltage noise filter 1 can be used in place of a high-voltage noise filter 113 (FIG. 2) in a power conversion device 102 (FIG. 1). However, in FIG. 2, a high-voltage battery 100 is located on a left side of the drawing and a power module 111 is located on a right side of the drawing, whereas in FIG. 4, arrangement on left and right sides is inverted thereto, specifically, the high-voltage battery 100 is located on right side of the drawing, and the power module 111 is located on the left side of the drawing.

The high-voltage noise filter 1 includes an anode bus bar 11P, a cathode bus bar 11N, an anode bus bar 12P, a cathode bus bar 12N, a magnetic core 13, an X capacitor 14, a Y capacitor 15P, a Y capacitor 15N, and cooling fins 16P and 16N, and these are housed in a metal housing 10 or arranged in a space provided in a metal housing (not illustrated) of the power conversion device 102 (FIG. 1).

The metal housing 10 is connected to, for example, the metal housing of the power conversion device 102 in which a cooling medium is circulated. Also, the metal housing 10 is grounded to a metal body of an electric vehicle or the like.

The anode bus bar 11P, the cathode bus bar 11N, the anode bus bar 12P, and the cathode bus bar 12N are conductive bars formed from a highly-conductive metal such as copper. The anode bus bar 11P and the cathode bus bar 11N are arranged on the high-voltage battery 100 side of the high-voltage noise filter 1, and include an XY plane extending in an X direction. The anode bus bar 12P and the cathode bus bar 12N extend in the X direction from the power module 111 side of the high-voltage noise filter 1 to the anode bus bar 11P and the cathode bus bar 11N, and include an XZ plane.

The anode bus bar 11P is connected to the anode bus bar 12P on the high-voltage battery 100 side of the magnetic core 13. Similarly, the cathode bus bar 11N is connected to the cathode bus bar 12N on the high-voltage battery 100 side of the magnetic core 13.

The anode bus bar 12P includes a protruding portion bent in a Y direction, the X direction, and the Y direction between the anode bus bar 11P and the magnetic core 13. Similarly, the cathode bus bar 12N includes a protruding portion bent in the Y direction, the X direction, and the Y direction between the cathode bus bar 11N and the magnetic core 13.

Similarly to the magnetic core 121 (FIG. 3), the magnetic core 13 includes the MnZn ferrite, the FINEMET (trademark), or the like formed in an annular shape, and the anode bus bar 12P and the cathode bus bar 12N are made to pass through a through hole located at a center thereof. The magnetic core 13 corresponds to a first magnetic core of the present invention.

The X capacitor 14 has one end connected to the anode bus bar 11P, and has the other end connected to the cathode bus bar 11N. The X capacitor 14 can attenuate a differential mode noise generated from the power module 111. Note that the X capacitor 14 may include a plurality of capacitors.

The Y capacitor 15P has one end connected to the anode bus bar 12P between the magnetic core 13 and the anode bus bar 11P, and has the other end grounded to the metal housing 10 via a ground G. The Y capacitor 15P corresponds to a first Y capacitor of the present invention. The Y capacitor 15N has one end connected to the cathode bus bar 12N between the magnetic core 13 and the cathode bus bar 11N, and has the other end grounded to the metal housing 10 via a ground G. The Y capacitor 15N corresponds to a second Y capacitor of the present invention. The Y capacitors 15P and 15N can attenuate a common mode noise generated from the power module 111. Note that each of the Y capacitors 15P and 15N may include a plurality of capacitors.

The cooling fins 16P and 16N each include, for example, a plate-like heat conductive material such as a metal, and are connected to an annular flat surface of the magnetic core 13 and the metal housing 10. Therefore, the cooling fins 16P and 16N can cool the magnetic core 13 by conducting heat generated from the magnetic core 13 to the metal housing 10. The cooling fins 16P and 16N correspond to a first cooling unit as well as a first flat surface portion of the present invention.

Additionally, the cooling fin 16P is arranged in a manner facing a part of the protruding shape of the anode bus bar 12P at a predetermined interval. Similarly, the cooling fin 16N is arranged in a manner facing a part of the protruding shape of the cathode bus bar 12N at a predetermined interval.

As a result, parasitic capacitance parallel to the Y capacitor 15P is generated between the cooling fin 16P grounded via the metal housing 10 and the part of the protruding shape of the anode bus bar 12P. Similarly, parasitic capacitance parallel to the Y capacitor 15N is generated between the cooling fin 16N grounded via the metal housing 10 and the part of the protruding shape of the cathode bus bar 12N.

The parasitic capacitance thus generated causes small parasitic inductance because a lead wire is not included unlike a general capacitor component. Consequently, the common mode noise can be more attenuated than in a case of adding, in parallel to the Y capacitors 15P and 15N, the general capacitor component that includes a lead wire, for example.

Next, an attenuation characteristic of an electromagnetic noise by the high-voltage noise filter 1 will be described.

Figure 6:
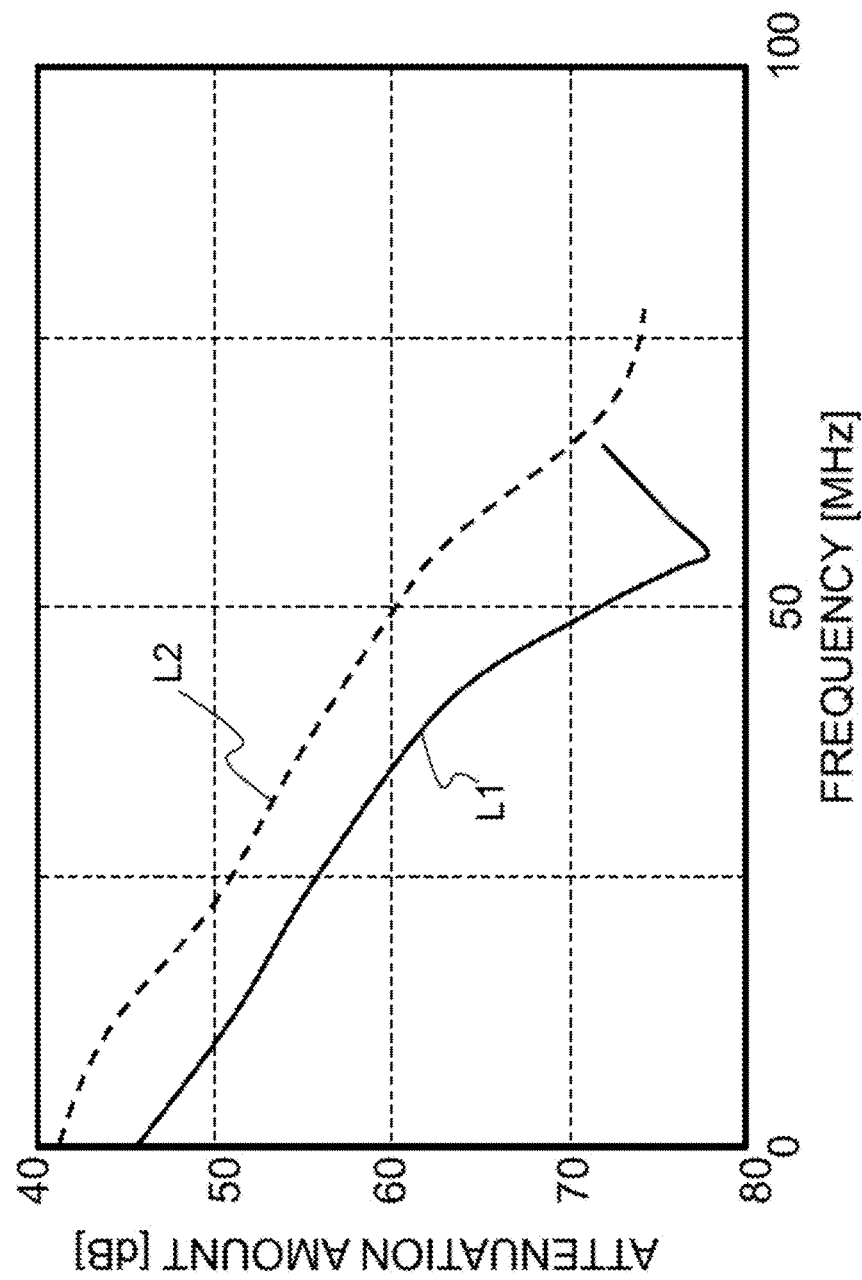
FIG. 6 is a graph illustrating an effect of an attenuation characteristic of an electromagnetic noise by the high-voltage noise filter.

FIG. 6 illustrates a difference in the attenuation characteristic of the electromagnetic noise between the high-voltage noise filter 1 and the high-voltage noise filter 113. In the drawing, a horizontal axis represents a frequency [MHz] of the electromagnetic noise, and a vertical axis represents an attenuation amount [dB]. Additionally, a solid line curve L1 represents the attenuation characteristic corresponding to the high-voltage noise filter 1, and a broken line curve L2 represents the attenuation characteristic corresponding to the high-voltage noise filter 113.

As it can be grasped from the curves L1 and L2, the high-voltage noise filter 1 has the attenuation characteristic of the electromagnetic noise more improved by about 5 to 10 [dB] in a range of 0 to about 60 [MHz], compared to the high-voltage noise filter 113. Such improvement in the attenuation characteristic can be deemed as an effect by the parasitic capacitance generated between the cooling fin 16P and the anode bus bar 12P and the parasitic capacitance generated between the cooling fin 16N and the cathode bus bar 12N.

Therefore, in the high-voltage noise filter 1, the magnetic core 13 can be cooled by conducting the heat from the magnetic core 13 to the metal housing 10 via the cooling fins 16P and 16N. The heat from the magnetic core 13 is generated due to the common mode noise generated in the power module 111 (FIG. 1). Furthermore, in the high-voltage noise filter 1, it is possible to improve a suppression effect of the common mode noise among electromagnetic noises generated from the power module 111 (FIG. 1).

<High-voltage Noise Filter 2 According to Second Embodiment of Present Invention>

Next, FIG. 7 is an XY plan view illustrating an exemplary configuration of a high-voltage noise filter 2 according to a second embodiment of the present invention.

The high-voltage noise filter 2 is obtained by adding an anode terminal 21P, a cathode terminal 21N, a magnetic core 22, cooling fins 23P and 23N, an anode terminal 24P, and a cathode terminal 24N to a high-voltage noise filter 1 (FIG. 4). Note that, among these constituent elements of the high-voltage noise filter 2, those common with the high-voltage noise filter 1 are denoted by the same reference signs, and descriptions thereof will be omitted.

The anode terminal 21P, the cathode terminal 21N, the anode terminal 24P, and the cathode terminal 24N each include a highly-conductive metal such as copper. The anode terminal 21P is connected to an end on a power module 111 side of an anode bus bar 12P. The cathode terminal 21N is connected to an end on the power module 111 side of the cathode bus bar 12N.

The anode terminal 24P is connected to an end on a high-voltage battery 100 side of an anode bus bar 11P. The cathode terminal 24N is connected to an end on the high-voltage battery 100 side of a cathode bus bar 11N. As a result, the high-voltage noise filter 2 can be easily and surely and electrically connected to the high-voltage battery 100.

The magnetic core 22 is formed similarly to a magnetic core 13. The magnetic core 22 is arranged between a portion bent into a protruding shape of the anode bus bar 12P and the anode bus bar 11P and between a portion bent into a protruding shape of the cathode bus bar 12N and the cathode bus bar 11N. The anode bus bar 12P and the cathode bus bar 12N are made to pass through a center space of the magnetic core 22. The magnetic core 22 corresponds to a second magnetic core of the present invention.

Each of the cooling fins 23P and 23N is formed in a shape similar to that of each of cooling fins 16P and 16N by using a material also similar thereto, and are connected to an annular flat surface of the magnetic core 22 and a metal housing 10. Therefore, in a case where the magnetic core 22 generates heat, the cooling fins 23P and 23N can cool the magnetic core 22 by conducting the heat to the metal housing 10. The cooling fins 23P and 23N correspond to a second cooling unit as well as a second flat surface portion of the present invention.

Additionally, the cooling fin 23P is arranged in a manner facing, at a predetermined interval, another part of the protruding shape of the anode bus bar 12P different from a part thereof facing the cooling fin 16P. Similarly, the cooling fin 23N is arranged in a manner facing, at the predetermined interval, another part of the protruding shape of the cathode bus bar 12N different from a part thereof facing the cooling fin 16N.

As a result, parasitic capacitance parallel to a Y capacitor 15P is generated between the cooling fin 23P grounded via the metal housing 10 and mentioned another part of the protruding shape of the anode bus bar 12P. Similarly, parasitic capacitance parallel to a Y capacitor 15N is generated between the cooling fin 23N grounded via the metal housing 10 and mentioned another part of the protruding shape of the cathode bus bar 12N.

The parasitic capacitance thus generated causes small parasitic inductance because a lead wire is not included unlike a general capacitor component. Therefore, a common mode noise can be more attenuated than in a case of adding, in parallel to the Y capacitors 15P and 15N, a general capacitor component that includes a lead wire.

Therefore, compared to the high-voltage noise filter 1, a cooling effect of the high-voltage noise filter can be more enhanced in whole, and a suppression effect of the common mode noise can also be more improved in the high-voltage noise filter 2.

<High-voltage Noise Filter 3 According to Third Embodiment of Present Invention>

Next, FIG. 8 is an XY plan view illustrating an exemplary configuration of a high-voltage noise filter 3 according to a third embodiment of the present invention.

The high-voltage noise filter 3 is obtained by replacing cooling fins 16P and 16N with a cooling fin 31 and replacing cooling fins 23P and 23N with a cooling fin 32 in a high-voltage noise filter 2 (FIG. 7). Note that, among these constituent elements of the high-voltage noise filter 3, those common with the high-voltage noise filters 1 and 2 are denoted by the same reference signs, and descriptions thereof will be omitted.

The cooling fin 31 is obtained by coupling and integrating the cooling fins 16P and 16N, and formed into a plate shape. The cooling fin 31 is connected to an annular flat surface of a magnetic core 13 and a metal housing 10. A center of the cooling fin 31 is formed with a through hole in order to allow an anode bus bar 12P and a cathode bus bar 12N to pass therethrough. Similarly, the cooling fins 32 is obtained by coupling and integrating the cooling fins 23P and 23N, and formed into a plate shape. The cooling fin 32 is connected to an annular flat surface of a magnetic core 22 and the metal housing 10. A center of the cooling fin 32 is formed with a through hole in order to allow the anode bus bar 12P and the cathode bus bar 12N to pass therethrough.

The high-voltage noise filter 3 has a common mode noise suppression effect equivalent to that of the high-voltage noise filter 2 (FIG. 7).

In the high-voltage noise filter 3, the area of the cooling fins in contact with the magnetic cores 13 and 22 is increased more than in the high-voltage noise filter 2, and therefore, the magnetic cores 13 and 22 can be cooled more effectively.

<High-voltage Noise Filter 4 According to Fourth Embodiment of Present Invention>

Next, FIG. 9 is an XY plan view illustrating an exemplary configuration of a high-voltage noise filter 4 according to a fourth embodiment of the present invention.

The high-voltage noise filter 4 is obtained by replacing a cooling fins 31 with a cooling fin 41 and replacing a cooling fin 32 with a cooling fin 42 in a high-voltage noise filter 3 (FIG. 8). Note that, among these constituent elements of the high-voltage noise filter 4, those common with the high-voltage noise filters 1 to 3 are denoted by the same reference signs, and descriptions thereof will be omitted.

Figure 10B:
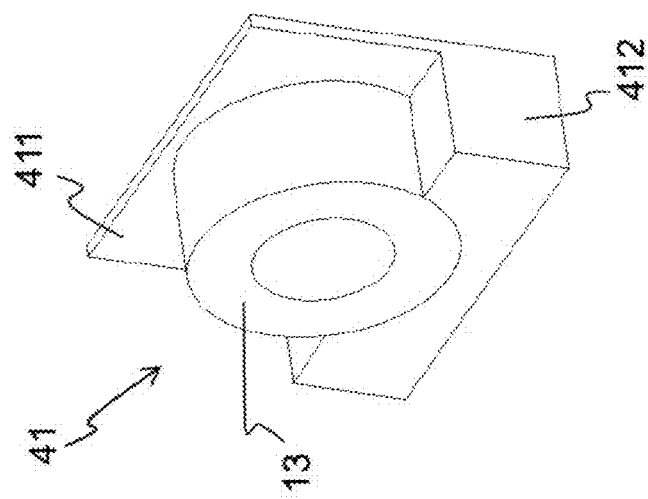
FIGS. 10A and 10B are views illustrating an exemplary shape of a cooling fin in the high-voltage noise filter of FIG. 9.
Figure 10A:
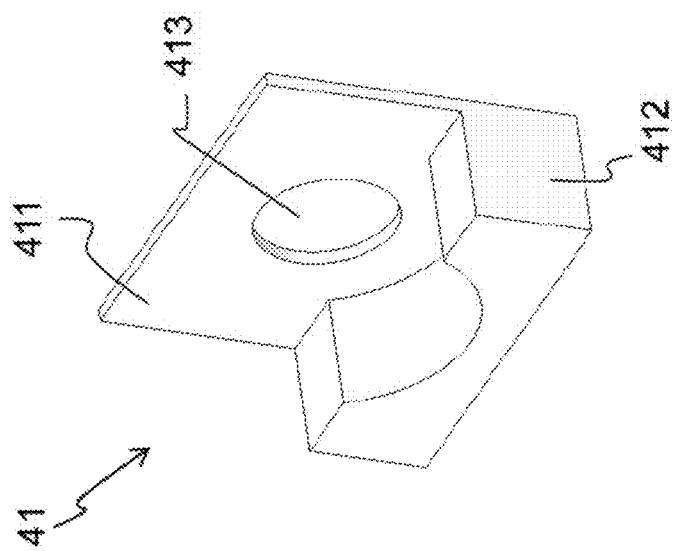

FIGS. 10A and 10B are views illustrating an exemplary shape of the cooling fin 41, FIG. 10A is the view illustrating a single body of the cooling fin 41, and FIG. 10B is the view illustrating a state in which the cooling fin 41 is connected to a magnetic core 13.

In the cooling fin 41, a flat surface portion 411 formed in a plate shape similar to the cooling fin 31 (FIG. 8) and a holding portion 412 having a substantially the same width as that of the magnetic core 13 are integrally formed by using a heat conductive material such as a metal. The flat surface portion 411 is formed with a through hole 413 in order to allow an anode bus bar 12P and a cathode bus bar 12N to pass therethrough. The flat surface portion 411 is connected to an annular flat surface of the magnetic core 13 and a metal housing 10. The holding portion 412 is connected to an outer peripheral curved surface of the magnetic core 13 and the metal housing 10, and can hold the magnetic core 13. Note that the width of the holding portion 412 is not limited to the example described above, and may be narrower or wider. Note that the cooling fin 42 also has a shape similar to that of the cooling fins 41 and is connected to a magnetic core 22 and the metal housing 10.

The high-voltage noise filter 4 has a common mode noise attenuation effect equivalent to that of the high-voltage noise filter 3 (FIG. 8).

In the high-voltage noise filter 4, since the cooling fins 41 and 42 are in contact with the broader area of the magnetic cores 13 and 22 than the cooling fins 31 and 32 of the high-voltage noise filter 3 are, the magnetic cores 13 and 22 can be further effectively cooled.

<High-voltage Noise Filter 5 According to Fifth Embodiment of Present Invention>

Next, FIG. 11 is an XY plan view illustrating an exemplary configuration of a high-voltage noise filter 5 according to a fifth embodiment of the present invention.

The high-voltage noise filter 5 is obtained by replacing a cooling fin 41 with a cooling unit 51 and also replacing a cooling fin 42 with a cooling unit 52 in a high-voltage noise filter 4 (FIG. 9). Note that, among these constituent elements of the high-voltage noise filter 5, those common with the high-voltage noise filters 1 to 4 are denoted by the same reference signs, and descriptions thereof will be omitted.

The cooling unit 51 is formed in a shape similar to a holding portion 412 (FIG. 10A and FIG. 10B) of the cooling fin 41 by using a heat conductive material such as a metal. In other words, the cooling unit 51 has a shape in which a flat surface portion 411 (FIG. 10A and FIG. 10B) is omitted from the cooling fin 41. The cooling unit 51 is connected to an outer peripheral curved surface of a magnetic core 13 and a metal housing 10. A cooling unit 52 has a shape similar to that of the cooling unit 51. The cooling unit 52 is connected to an outer peripheral curved surface of a magnetic core 22 and the metal housing 10.

The high-voltage noise filter 5 has a common mode noise attenuation effect equivalent to that of a high-voltage noise filter 3 (FIG. 8).

In the high-voltage noise filter 5, since the cooling units 51 and 52 are in contact with the magnetic cores 13 and 22, the magnetic cores 13 and 22 can be effectively cooled.

<High-voltage Noise Filter 6 According to Sixth Embodiment of Present Invention>

Figure 12:
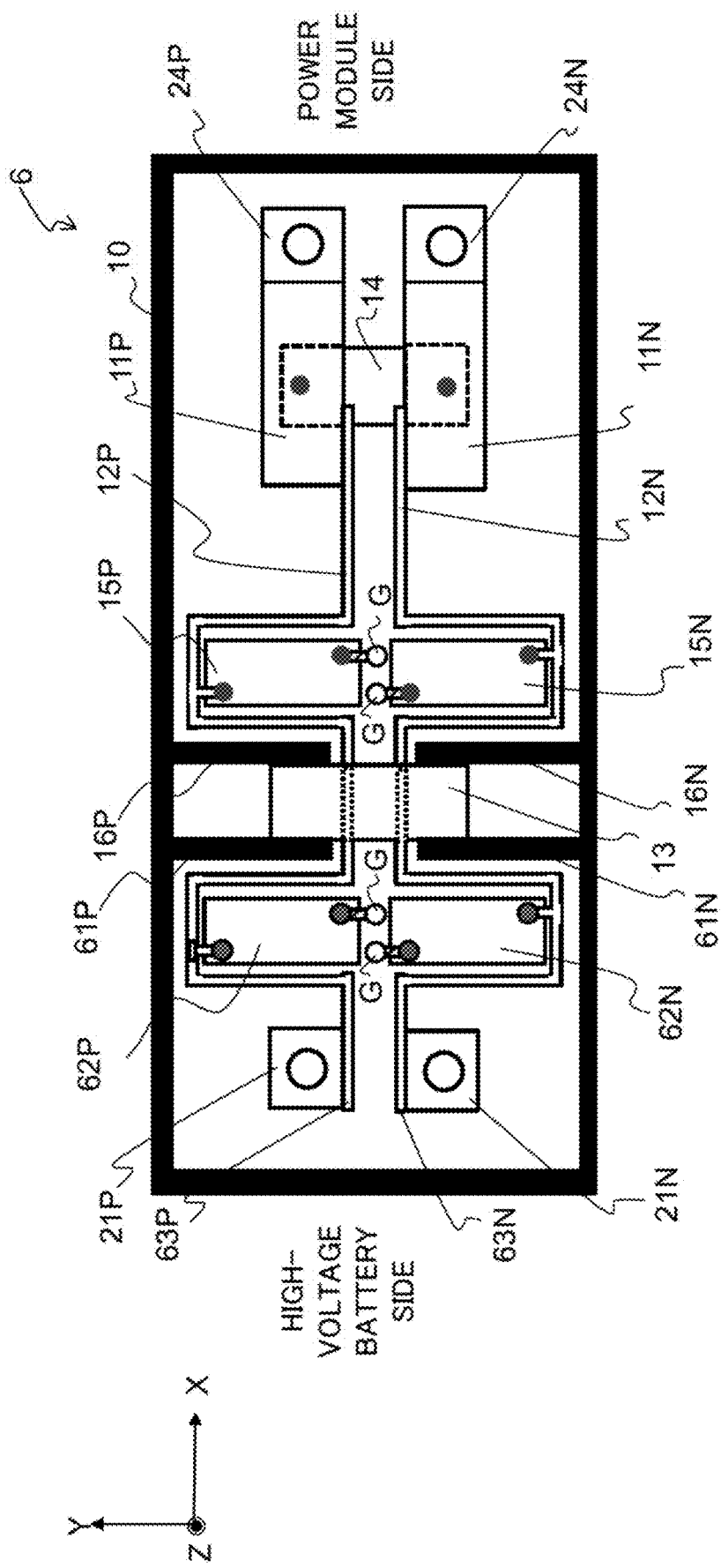
FIG. 12 is an XY plan view illustrating an exemplary configuration of a high-voltage noise filter according to a sixth embodiment of the present invention.

Next, FIG. 12 is an XY plan view illustrating an exemplary configuration of a high-voltage noise filter 6 according to a sixth embodiment of the present invention.

The high-voltage noise filter 6 is obtained by adding a cooling fin 61 on an opposite annular surface of a magnetic core 13 with respect to the cooling fin 16 of a high-voltage noise filter 1 (FIG. 4), and further adding a plurality of Y capacitors, specifically, Y capacitors 62P and 62N. Note that, among these constituent elements of the high-voltage noise filter 6, those common with the high-voltage noise filters 1 to 5 are denoted by the same reference signs, and descriptions thereof will be omitted.

The cooling fin 61 is formed in a shape similar to the cooling fin 16 by using a heat conductive material such as a metal. The cooling fin 61 is connected to an annular flat surface of the magnetic core 13 and a metal housing 10.

An anode bus bar 63P and a cathode bus bar 63N are connected to an anode bus bar 12P and a cathode bus bar 12N respectively, pass through the magnetic core 13, and reach an anode terminal 21P and a cathode terminal 21N respectively. Each of the anode bus bar 63P and the cathode bus bar 63N is bent in a protruding shape, and a cooling fin 61P is arranged in a manner facing, at a predetermined interval, another part of the protruding shape of the anode bus bar 63P different from a part thereof facing the cooling fin 61P. Similarly, a cooling fin 61N is arranged in a manner facing, at a predetermined interval, another part of the protruding shape of the cathode bus bar 63N different from a part thereof facing the cooling fin 61N.

The Y capacitor 62P has one end connected to the anode bus bar 63P between the magnetic core 13 and the anode terminal 21P, and has the other end grounded to the metal housing 10 via a ground G. The Y capacitor 62P corresponds to a third Y capacitor of the present invention. The Y capacitor 62N has one end connected to the cathode bus bar 63N between the magnetic core 13 and the cathode terminal 21N, and has the other end grounded to the metal housing 10 via a ground G. The Y capacitor 62N corresponds to a fourth Y capacitor of the present invention. The Y capacitors 62P and 62N can attenuate a common mode noise generated from a power module 111.

The high-voltage noise filter 6 has a common mode noise attenuation effect equivalent to or more than that of a high-voltage noise filter 3 (FIG. 8).

In the high-voltage noise filter 6, since the cooling fins 16 and 61 are in contact with the magnetic core 13, the magnetic core 13 can be effectively cooled.

CONCLUSION

According to the high-voltage noise filters 1 to 6 described above, both heat dissipation from the magnetic cores 13 and 22 and improvement in the suppression effect of an electromagnetic noise, particularly, the common mode noise generated from the power module 111 can be achieved without providing a heat sink, increasing capacitance of a Y capacitor, and adding a capacitor component.

Furthermore, the present invention is not limited to the above-described embodiments, and it is possible to make various modifications such as combination thereof as appropriate. For example, the above-described respective embodiments are described in detail for easy understanding of the present invention, and are not necessarily limited to the one including all of the configurations described above. Additionally, a part of a configuration of a certain embodiment can be replaced with or added to a configuration of another embodiment.

What is claimed is:

1. A power conversion device comprising:
    a power module configured to convert DC current to AC current; and
    a high-voltage noise filter configured to suppress an electromagnetic noise generated from the power module,
    the high-voltage noise filter including:
    a metal housing that is grounded;

an anode bus bar connecting an anode of a power source of the DC current and an anode of the power module;
a cathode bus bar connecting a cathode of the power source and a cathode of the power module;
a first magnetic core formed in an annular shape and having a through hole where the anode bus bar and the cathode bus bar are made to pass through;
an X capacitor having one end connected to the anode bus bar and having another end connected to the cathode bus bar;
a first Y capacitor having one end connected to the anode bus bar and having another end grounded;
a second Y capacitor having one end connected to the cathode bus bar and having another end grounded; and
a first cooling unit connected to the first magnetic core and the metal housing, wherein
a part of the anode bus bar is arranged in a manner facing the first cooling unit, and
a part of the cathode bus bar is arranged in a manner facing the first cooling unit.

2. The power conversion device according to claim 1, wherein
the first cooling unit has a flat surface portion in contact with an annular flat surface of the first magnetic core.

3. The power conversion device according to claim 1, wherein
the first cooling unit includes a holding portion connected to an outer peripheral curved surface of the first magnetic core.

4. The power conversion device according to claim 1, wherein
the first cooling unit includes: a flat surface portion in contact with an annular flat surface of the first magnetic core; and a holding portion connected to an outer peripheral curved surface of the first magnetic core.

5. The power conversion device according to claim 1, wherein,
in the first cooling unit, a portion arranged in a manner facing the part of the anode bus bar and a portion arranged in a manner facing the part of the cathode bus bar are separated.

6. The power conversion device according to claim 1, wherein,
in the first cooling unit, a portion arranged in a manner facing the part of the anode bus bar and a portion arranged in a manner facing the part of the cathode bus bar are integrated.

7. The power conversion device according to claim 2, wherein
the anode bus bar is bent into a protruding shape, and a part of the protruding shape of the anode bus bar is arranged in a manner facing the flat surface portion of the first cooling unit, and
the cathode bus bar is bent into a protruding shape, and a part of the protruding shape of the cathode bus bar is arranged in a manner facing the flat surface portion of the first cooling unit.

8. The power conversion device according to claim 1, wherein
the high-voltage noise filter includes:
a second magnetic core formed in an annular shape and having a through hole where the anode bus bar and the cathode bus bar are made to pass through; and
a second cooling unit connected to the second magnetic core and the metal housing,
a part of the anode bus bar is arranged in a manner facing the second cooling unit, and
a part of the cathode bus bar is arranged in a manner facing the second cooling unit.

9. The power conversion device according to claim 8, wherein
the first magnetic core is arranged on the power module side of the first Y capacitor and the second Y capacitor,
the second magnetic core is arranged on the power source side of the first Y capacitor and the second Y capacitor.

10. The power conversion device according to claim 8, wherein
the first cooling unit has a first flat surface portion in contact with an annular flat surface of the first magnetic core, and
the second cooling unit has a second flat surface portion in contact with an annular flat surface of the second magnetic core.

11. The power conversion device according to claim 10, wherein
the anode bus bar is bent into a protruding shape, a part of the protruding shape of the anode bus bar is arranged in a manner facing the first flat surface portion of the first cooling unit, and another part of the protruding shape of the anode bus bar is arranged in a manner facing the second flat surface portion of the second cooling unit, and
the cathode bus bar is bent into a protruding shape, a part of the protruding shape of the cathode bus bar is arranged in a manner facing the first flat surface portion of the first cooling unit, and another part of the protruding shape of the cathode bus bar is arranged in a manner facing the second flat surface portion of the second cooling unit.

12. The power conversion device according to claim 1, further comprising, on an opposite side of the first magnetic core to which the X capacitor is not connected:
a third Y capacitor having one end connected to the anode bus bar and having another end grounded;
a fourth Y capacitor having one end connected to the cathode bus bar and having another end grounded; and
a first cooling unit and a second cooling unit which are connected to the first magnetic core and the metal housing, wherein
a part of an anode bus bar located on a side where the X capacitor is arranged is arranged in a manner facing the first cooling unit,
a part of a cathode bus bar located on the side where the X capacitor is arranged is arranged in a manner facing the first cooling unit,
a part of the anode bus bar located on a side where the X capacitor is not arranged is arranged in a manner facing the second cooling unit, and
a part of the cathode bus bar located on the side where the X capacitor is not arranged is arranged in a manner facing the second cooling unit.

13. The power conversion device according to claim 12, wherein
each of the first cooling unit and the second cooling unit includes a flat surface portion in contact with the annular flat surface of the first magnetic core.

14. The power conversion device according to claim 12, wherein
each of the first cooling unit and the second cooling unit includes a holding portion connected to an outer peripheral curved surface of the first magnetic core.

15. The power conversion device according to claim 12, wherein each of the first cooling unit and the second cooling unit includes a flat surface portion in contact with the annular flat surface of the first magnetic core, and a holding portion connected to an outer peripheral curved surface of the first magnetic core.

16. The power conversion device according to claim 12, wherein
in each of the first cooling unit and the second cooling unit, a portion arranged in a manner facing the part of the anode bus bar and a portion arranged in a manner facing the part of the cathode bus bar are separated.

17. The power conversion device according to claim 12, wherein
in each of the first cooling unit and the second cooling unit, a portion arranged in a manner facing the part of the anode bus bar and a portion arranged in a manner facing the part of the cathode bus bar are integrated.

18. The power conversion device according to claim 13, wherein
the anode bus bar is bent into a protruding shape, and a part of the protruding shape of the anode bus bar is arranged in a manner facing the flat surface portion of each of the first cooling unit and the second cooling unit, and
the cathode bus bar is bent into a protruding shape, and a part of the protruding shape of the cathode bus bar is arranged in a manner facing the flat surface portion of each of the first cooling unit and the second cooling unit.

19. A high-voltage noise filter comprising:
a metal housing that is grounded;
an anode bus bar connected to an anode of DC current;
a cathode bus bar connected to a cathode of the DC current;
a first magnetic core formed in an annular shape and having a through hole where the anode bus bar and the cathode bus bar are made to pass through;
an X capacitor having one end connected to the anode bus bar and having another end connected to the cathode bus bar;
a first Y capacitor having one end connected to the anode bus bar and having another end grounded;
a second Y capacitor having one end connected to the cathode bus bar and having another end grounded; and
a first cooling unit connected to the first magnetic core and the metal housing, wherein
a part of the anode bus bar is arranged in a manner facing the first cooling unit, and
a part of the cathode bus bar is arranged in a manner facing the first cooling unit.

20. A high-voltage noise filter comprising:
a metal housing that is grounded;
an anode bus bar connected to an anode of DC current;
a cathode bus bar connected to a cathode of the DC current;
a first magnetic core formed in an annular shape and having a through hole where the anode bus bar and the cathode bus bar are made to pass through;
an X capacitor having one end connected to the anode bus bar and having another end connected to the cathode bus bar;
a first Y capacitor having one end connected to the anode bus bar and having another end grounded; and
a second Y capacitor having one end connected to the cathode bus bar and having another end grounded,
the high-voltage noise filter further comprising, on an opposite side of the first magnetic core where the X capacitor is not connected:
a third Y capacitor having one end connected to the anode bus bar and having another end grounded;
a fourth Y capacitor having one end connected to the cathode bus bar and having another end grounded; and
a first cooling unit and a second cooling unit each connected to the first magnetic core and the metal housing, wherein
a part of the anode bus bar located on a side where the X capacitor is arranged is arranged in a manner facing the first cooling unit,
a part of the cathode bus bar located on the side where the X capacitor is arranged is arranged in a manner facing the first cooling unit,
a part of the anode bus bar located on a side where the X capacitor is not arranged is arranged in a manner facing the second cooling unit, and
a part of the cathode bus bar located on the side where the X capacitor is not arranged is arranged in a manner facing the second cooling unit.

* * * * *